United States Patent
Noller et al.

(10) Patent No.: US 9,443,739 B2
(45) Date of Patent: Sep. 13, 2016

(54) PROCESS FOR THE MANUFACTURE OF SEMICONDUCTOR DEVICES COMPRISING THE CHEMICAL MECHANICAL POLISHING OF ELEMENTAL GERMANIUM AND/OR $SI_{1-x}GE_x$ MATERIAL IN THE PRESENCE OF A CMP COMPOSITION COMPRISING A SPECIFIC ORGANIC COMPOUND

(75) Inventors: Bastian Marten Noller, Lorsch (DE); Bettina Drescher, Ludwigshafen (DE); Christophe Gillot, Bierbeek (BE); Yuzhuo Li, Potsdam, NY (US); Ning Gao, legal representative, Potsdam, NY (US)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/236,539

(22) PCT Filed: Jul. 30, 2012

(86) PCT No.: PCT/IB2012/053877
§ 371 (c)(1),
(2), (4) Date: Jan. 31, 2014

(87) PCT Pub. No.: WO2013/018015
PCT Pub. Date: Feb. 7, 2013

(65) Prior Publication Data
US 2014/0170852 A1 Jun. 19, 2014

Related U.S. Application Data

(60) Provisional application No. 61/513,694, filed on Aug. 1, 2011.

(51) Int. Cl.
| | | |
|---|---|---|
| H01L 21/302 | (2006.01) |
| H01L 21/461 | (2006.01) |
| H01L 21/311 | (2006.01) |
| C03C 15/00 | (2006.01) |
| C03C 25/68 | (2006.01) |
| H01L 21/306 | (2006.01) |
| H01L 21/321 | (2006.01) |
| H01L 21/3105 | (2006.01) |
| C23F 3/00 | (2006.01) |
| C09K 3/14 | (2006.01) |
| C09G 1/02 | (2006.01) |
| H01L 21/02 | (2006.01) |

(52) U.S. Cl.
CPC .......... *H01L 21/30625* (2013.01); *C09G 1/02* (2013.01); *C09K 3/1463* (2013.01); *C23F 3/00* (2013.01); *H01L 21/02024* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 5,897,375 A | 4/1999 | Watts et al. | |
| 7,160,482 B2 * | 1/2007 | Vos et al. | 252/79.1 |
| 7,897,061 B2 | 3/2011 | Dysard et al. | |
| 2002/0197935 A1 * | 12/2002 | Mueller et al. | 451/36 |
| 2006/0175295 A1 | 8/2006 | Chu et al. | |
| 2006/0218867 A1 | 10/2006 | Koshiyama et al. | |
| 2007/0178700 A1 * | 8/2007 | Dysard et al. | 438/689 |
| 2008/0265375 A1 | 10/2008 | Pietsch et al. | |
| 2009/0001339 A1 | 1/2009 | Lee et al. | |
| 2009/0057661 A1 * | 3/2009 | Siddiqui et al. | 257/42 |
| 2009/0057834 A1 | 3/2009 | Schlueter et al. | |
| 2010/0130012 A1 | 5/2010 | Schwandner et al. | |
| 2011/0045654 A1 * | 2/2011 | Martinez et al. | 438/458 |

FOREIGN PATENT DOCUMENTS

| | | |
|---|---|---|
| CN | 1223308 A | 7/1999 |
| CN | 101370897 A | 2/2009 |
| WO | WO 2004/063301 A1 | 7/2004 |
| WO | WO 2005/007770 A1 | 1/2005 |
| WO | 2010/001028 * | 1/2010 |

OTHER PUBLICATIONS

U.S. Appl. No. 14/130,629, filed Jan. 2, 2014, Noller, et al.
International Search Report issued Jan. 17, 2013 in PCT/IB2012/053877.

\* cited by examiner

*Primary Examiner* — Stephanie Duclair
(74) *Attorney, Agent, or Firm* — Oblon, McClelland, Maier & Neustadt, L.L.P.

(57) ABSTRACT

A process for the manufacture of semiconductor devices comprising the chemical mechanical polishing of elemental germanium and/or $Si_{1-x}Ge_x$ material with $0.1 \leq x < 1$ in the presence of a chemical mechanical polishing (CMP) composition comprising: (A) inorganic particles, organic particles, or a mixture or composite thereof, (B) at least one type of an oxidizing agent, (C) at least one type of an organic compound which comprises at least {k} moieties (Z), but excluding salts whose anions are inorganic and whose only organic cation is $[NR^{11}R^{12}R^{13}R^{14}]^+$, wherein {k} is 1, 2 or 3, (Z) is a hydroxyl (—OH), alkoxy (—$OR^1$), heterocyclic alkoxy (—$OR^1$ as part of a heterocyclic structure), carboxylic acid (—COOH), carboxylate (—$COOR^2$), amino (—$NR^3R^4$), heterocyclic amino (—$NR^3R^4$ as part of a heterocyclic structure), imino (=N—$R^5$ or —N=$R^6$), heterocyclic imino (=N—$R^5$ or —N=$R^6$ as part of a heterocyclic structure), phosphonate (—P(=O)($OR^7$)($OR^8$)), phosphate (-O-P(=O)($OR^9$)($OR^{10}$)), phosphonic acid (—P(=O)(OH)$_2$), phosphoric acid (-O-P(=O)(OH)$_2$) moiety, or their protonated or deprotonated forms, $R^1$, $R^2$, $R^7$, $R^9$ is— independently from each other—alkyl, aryl, alkylaryl, or arylalkyl, $R^3$, $R^4$, $R^5$, $R^8$, $R^{10}$ is—independently from each other—H, alkyl, aryl, alkylaryl, or arylalkyl, $R^6$ is alkylene, or arylalkylene, $R^{11}$, $R^{12}$, $R^{13}$ is—independently from each other—H, alkyl, aryl, alkylaryl, or arylalkyl, and $R^{11}$, $R^{12}$, $R^{13}$ does not comprise any moiety (Z), $R^{14}$ is alkyl, aryl, alkylaryl, or arylalkyl, and $R^{14}$ does not comprise any moiety (Z), and (D) an aqueous medium.

17 Claims, No Drawings

PROCESS FOR THE MANUFACTURE OF SEMICONDUCTOR DEVICES COMPRISING THE CHEMICAL MECHANICAL POLISHING OF ELEMENTAL GERMANIUM AND/OR $SI_{1-x}GE_x$ MATERIAL IN THE PRESENCE OF A CMP COMPOSITION COMPRISING A SPECIFIC ORGANIC COMPOUND

This invention essentially relates to a chemical mechanical polishing (CMP) composition and its use in polishing substrates of the semiconductor industry. The process according to the invention comprises the chemical mechanical polishing of elemental germanium and/or $Si_{1-x}Ge_x$ in the presence of a specific CMP composition.

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, processes for the chemical-mechanical polishing of germanium-containing layers are known and described, for instance, in the following references.

US 2010/0130012 A1 discloses a method for polishing a semiconductor wafer provided with a strained-relaxed layer of $Si_{1-x}Ge_x$, comprising a first step of a mechanical machining of the $Si_{1-x}Ge_x$ layer of the semiconductor wafer in a polishing machine using a polishing pad containing fixedly bonded abrasive materials having a particle size of 0.55 µm or less, and a second step of chemo mechanical machining of the previously mechanically machined $Si_{1-x}Ge_x$ layer of the semiconductor wafer using a polishing pad and with supply of a polishing agent slurry containing abrasive materials. The polishing agent solution can contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof.

US 2008/0265375 A1 discloses a method for the single-sided polishing of semiconductor wafers which are provided with a relaxed $Si_{1-x}Ge_x$ layer, comprising: the polishing of a multiplicity of semiconductor wafers in a plurality of polishing runs, a polishing run comprising at least one polishing step and at least one of the multiplicity of semiconductor wafers being obtained with a polished $Si_{1-x}Ge_x$ layer at the end of each polishing run; and moving the at least one semiconductor wafer during the at least one polishing step over a rotating polishing plate provided with a polishing cloth while applying polishing pressure, and supplying polishing agent between the polishing cloth and the at least one semiconductor wafer, a polishing agent being supplied which contains an alkaline component and a component that dissolves germanium. The component that dissolves germanium can comprise hydrogen peroxide, ozone, sodium hypochlorite or a mixture thereof. The alkaline component can comprise potassium carbonate ($K_2CO_3$), potassium hydroxide (KOH), sodium hydroxide (NaOH), ammonium hydroxide ($NH_4OH$), tetramethylammonium hydroxide ($N(CH_3)_4OH$), or a mixture thereof.

FR 2876610 A1 discloses a process for the polishing of a germanium surface including a polishing operation with at least one polishing agent and a mild etching solution for germanium. The etching solution can be a solution selected from a hydrogen peroxide solution, water, a solution of $H_2SO_4$ solution, a solution of HCl, a solution of HF, a solution of NaOCl, a solution of NaOH, a solution of $NH_4OH$, a solution of KOH solution, a solution of $Ca(ClO)_2$, or a mixture of two or more of these solutions.

US 2006/0218867 A1 discloses a polishing composition for use in polishing germanium or silicon-germanium single crystal, the polishing composition comprising sodium hypochlorite, colloidal silica and water, wherein the effective chlorine concentration in the polishing composition is 0.5 to 2.5%, and the content of colloidal silica in the polishing composition is 1 to 13% by weight.

US 2011/0045654 A1 discloses a method for polishing a structure (12) comprising at least one surface layer of germanium (121), characterized in that it comprises a first step of chemical-mechanical polishing of the surface (121a) of the germanium layer (121) carried out with a first polishing solution having an acidic pH, and a second step of chemical-mechanical polishing of the surface of the germanium layer (121) carried out with a second polishing solution having an alkaline pH.

In the state of the art, processes for the chemical-mechanical polishing of germanium-containing alloys, such as germanium-antimony-tellurium (GST) alloys, are known and described, for instance, in the following references.

US 2009/0057834 A1 discloses a method for chemical mechanical planarization of a surface having at least one feature thereon comprising a chalcogenide material, said method comprising the steps of: A) placing a substrate having the surface having the at least one feature thereon comprising a chalcogenide material in contact with a polishing pad; B) delivering a polishing composition comprising: b) an abrasive; and b) an oxidizing agent; and C) polishing the substrate with the polishing composition. The chalcogenide material is for example an alloy of germanium, antimony, and tellurium.

US 2009/0057661 A1 discloses a method for chemical mechanical planarization of a surface having at least one feature thereon comprising a chalcogenide material, said method comprising the steps of: A) placing a substrate having the surface having the at least one feature thereon comprising a chalcogenide material in contact with a polishing pad; B) delivering a polishing composition comprising: a) a surface-modified abrasive having a positive zeta potential; and b) an oxidizing agent; and C) polishing the substrate with the polishing composition. The chalcogenide material is for example an alloy of germanium, antimony, and tellurium.

US 2009/0001339 A1 discloses a slurry composition for chemical mechanical polishing (CMP) of a phase-change memory device, comprising deionized water and a nitrogenous compound. The phase-change memory device preferably comprises at least one compound selected from InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe) or $Te_{81}Ge_{15}Sb_2S_2$. The nitrogenous compound can be one compound selected from aliphatic amines, aromatic amines, ammonium salts, ammonium bases, or a combination thereof.

US 2007/0178700 A1 discloses a chemical-mechanical polishing (CMP) composition for polishing a phase change alloy-containing substrate, the composition comprising: (a) a particulate abrasive material in an amount of not more than about 3 percent by weight; (b) at least one chelating agent capable of chelating the phase change alloy, a component thereof, or a substance formed from the phase change alloy material during chemical-mechanical polishing; and (c) an aqueous carrier therefor. The phase change alloy is for example a germanium-antimony-tellurium (GST) alloy. The chelating agent can comprise at least one compound selected from the group consisting of a dicarboxylic acid, a polycarboxylic acid, an amino carboxylic acid, a phosphate, a polyphosphate, an amino phosphonate, and a phosphonocarboxylic acid, a polymeric chelating agent, and a salt thereof.

One of the objects of the present invention was to provide a CMP composition and a CMP process appropriate for the chemical-mechanical polishing of elemental germanium and/or $Si_{1-x}Ge_x$ and showing an improved polishing performance, particularly a high material removal rate (MRR) of germanium and/or $Si_{1-x}Ge_x$ material (with $0.1 \leq x < 1$), or a high selectivity of germanium and/or $Si_{1-x}Ge_x$ to silicon dioxide (Ge and/or $Si_{1-x}Ge_x$:$SiO_2$ selectivity), or a low static etching rate (SER) of germanium and/or $Si_{1-x}Ge_x$, or the combination of high germanium and/or $Si_{1-x}Ge_x$ MRR and high Ge and/or $Si_{1-x}Ge_x$:$SiO_2$ selectivity and/or low germanium and/or $Si_{1-x}Ge_x$ SER. Furthermore, one of the objects of the present invention was to provide a CMP composition and a CMP process appropriate for the chemical-mechanical polishing of elemental germanium and/or $Si_{1-x}Ge_x$ which has been filled or grown in trenches between the STI (shallow-trench isolation) silicon dioxide. A further object of the present invention was to provide a CMP composition and a CMP process appropriate for the chemical-mechanical polishing of elemental germanium and/or $Si_{1-x}Ge_x$ which has the shape of a layer and/or overgrowth and has a germanium and/or $Si_{1-x}Ge_x$ content of more than 98% by weight of the corresponding layer and/or overgrowth. Moreover, a CMP process was sought that is easy to apply and requires as few steps as possible.

Accordingly, a process for the manufacture of semiconductor devices comprising the chemical mechanical polishing of elemental germanium and/or $Si_{1-x}Ge_x$ material with $0.1 \leq x < 1$ in the presence of a chemical mechanical polishing (CMP) composition (referred to as (Q) or CMP composition (Q) in the following) comprising
(A) inorganic particles, organic particles, or a mixture or composite thereof,
(B) at least one type of an oxidizing agent,
(C) at least one type of an organic compound which comprises at least {k} moieties (Z), but excluding salts (S) whose anions are inorganic and whose only organic cation is $[NR^{11}R^{12}R^{13}R^{14}]^+$, wherein {k} is 1, 2 or 3,
(Z) is a hydroxyl (—OH), alkoxy (—$OR^1$), heterocyclic alkoxy (—$OR^1$ as part of a heterocyclic structure), carboxylic acid (—COOH), carboxylate (—$COOR^2$), amino (—$NR^3R^4$), heterocyclic amino (—$NR^3R^4$ as part of a heterocyclic structure), imino (=N—$R^5$ or —N=$R^6$), heterocyclic imino (=N—$R^5$ or —N=$R^6$ as part of a heterocyclic structure), phosphonate (—P(=O)($OR^7$)($OR^8$)), phosphate (—O—P(=O)($OR^9$)($OR^{10}$)), phosphonic acid (—P(=O)$(OH)_2$), phosphoric acid (—O—P(=O)$(OH)_2$) moiety, or their protonated or deprotonated forms,
$R^1$, $R^2$, $R^7$, $R^9$ is—independently from each other—alkyl, aryl, alkylaryl, or arylalkyl,
$R^3$, $R^4$, $R^5$, $R^8$, $R^{10}$ is—independently from each other—H, alkyl, aryl, alkylaryl, or arylalkyl,
$R^6$ is alkylene, or arylalkylene,
$R^{11}$, $R^{12}$, $R^{13}$ is—independently from each other—H, alkyl, aryl, alkylaryl, or arylalkyl, and $R^{11}$, $R^{12}$, $R^{13}$ does not comprise any moiety (Z),
$R^{14}$ is alkyl, aryl, alkylaryl, or arylalkyl, and $R^{14}$ does not comprise any moiety (Z),
and
(D) an aqueous medium.
was found.

Moreover, the use of the CMP composition (Q) for chemical-mechanical polishing of a substrate comprising an elemental germanium and/or $Si_{1-x}Ge_x$ layer and/or overgrowth was found.

Preferred embodiments are explained in the claims and the specification. It is understood that combinations of preferred embodiments are within the scope of the present invention.

A semiconductor device can be manufactured by the process of the invention, said process comprises the chemical mechanical polishing of elemental germanium and/or $Si_{1-x}Ge_x$ material (with $0.1 \leq x < 1$) in the presence of the CMP composition (Q), preferably, said process comprises the chemical mechanical polishing of elemental germanium and/or $Si_{1-x}Ge_x$ in the presence of the CMP composition (Q). Generally, this elemental germanium and/or $Si_{1-x}Ge_x$ can be of any type, form, or shape of elemental germanium and/or $Si_{1-x}Ge_x$. This elemental germanium and/or $Si_{1-x}Ge_x$ preferably has the shape of a layer and/or overgrowth. If this elemental germanium and/or $Si_{1-x}Ge_x$ has the shape of a layer and/or overgrowth, the germanium and/or $Si_{1-x}Ge_x$ content is preferably more than 90%, more preferably more than 95%, most preferably more than 98%, particularly more than 99%, for example more than 99.9% by weight of the corresponding layer and/or overgrowth. Generally, this elemental germanium and/or $Si_{1-x}Ge_x$ can be produced or obtained in different ways. This elemental germanium and/or $Si_{1-x}Ge_x$ has been preferably filled or grown in trenches between other substrates, more preferably filled or grown in trenches between silicon dioxide, silicon, or other isolating and semiconducting material used in the semiconductor industry, most preferably filled or grown in trenches between the STI (shallow-trench isolation) silicon dioxide, particularly grown in trenches between the STI silicon dioxide in a selective epitaxial growth process. If this elemental germanium and/or $Si_{1-x}Ge_x$ has been filled or grown in trenches between the STI silicon dioxide, the depth of said trenches is preferably from 20 to 500 nm, more preferably from 150 to 400 nm, and most preferably from 250 to 350 nm, particularly from 280 to 320 nm. In another embodiment, if this elemental germanium and/or $Si_{1-x}Ge_x$ has been filled or grown in trenches between silicon dioxide, silicon, or other isolating and semiconducting material used in the semiconductor industry, the depth of said trenches is preferably from 5 to 100 nm, more preferably from 8 to 50 nm, and most preferably from 10 to 35 nm, particularly from 15 to 25 nm.

Elemental germanium is germanium in form of its chemical element and does not include germanium salts or germanium alloys with a content of less than 90% germanium by weight of the corresponding alloy.

Said $Si_{1-x}Ge_x$ material (with $0.1 \leq x < 1$) can be of any type, form, or shape of $Si_{1-x}Ge_x$ material with $0.1 \leq x < 1$. Generally, x can be any value in the range of $0.1 \leq x < 1$. Preferably, x is in the range of $0.1 \leq x < 0.8$, more preferably, x is in the range of $0.1 \leq x < 0.5$, most preferably, x is in the range of $0.1 \leq x < 0.3$, for example x is 0.2. Said $Si_{1-x}Ge_x$ material is preferably a $Si_{1-x}Ge_x$ layer, more preferably a strain-relaxed $Si_{1-x}Ge_x$ layer. This strain-relaxed $Si_{1-x}Ge_x$ layer can be the one described in paragraph [0006] of US 2008/0265375 A1.

If the process of the invention comprises the chemical mechanical polishing of a substrate comprising elemental germanium and/or $Si_{1-x}Ge_x$ and silicon dioxide, the selectivity of germanium and/or $Si_{1-x}Ge_x$ to silicon dioxide with regard to the material removal rate is preferably higher than 10:1, more preferably higher than 20:1, most preferably higher than 30:1, particularly higher than 50:1, especially higher than 75:1, for example higher than 100:1. This selectivity can be adjusted for example by the type and concentration of organic compound (C) of the CMP composition (Q) and by setting other parameters such as the pH value.

The CMP composition (Q) is used for chemical-mechanical polishing of a substrate comprising elemental germanium and/or $Si_{1-x}Ge_x$ material (with $0.1 \leq x < 1$), preferably for chemical-mechanical polishing of a substrate comprising an elemental germanium and/or $Si_{1-x}Ge_x$ layer and/or overgrowth. The germanium and/or $Si_{1-x}Ge_x$ content of said elemental germanium and/or $Si_{1-x}Ge_x$ layer and/or overgrowth is preferably more than 90%, more preferably more than 95%, most preferably more than 98%, particularly more than 99%, for example more than 99.9% by weight of the corresponding layer and/or overgrowth. The elemental germanium and/or $Si_{1-x}Ge_x$ layer and/or overgrowth can be obtained in different ways, preferably by filling or growing in trenches between other substrates, more preferably by filling or growing in trenches between silicon dioxide, silicon, or other isolating and semiconducting material used in the semiconductor industry, most preferably by filling or growing in trenches between the STI (shallow-trench isolation) silicon dioxide, particularly by growing in trenches between the STI silicon dioxide in a selective epitaxial growth process.

If the CMP composition (Q) is used for polishing a substrate comprising elemental germanium and silicon dioxide, the selectivity of germanium and/or $Si_{1-x}Ge_x$ to silicon dioxide with regard to the material removal rate is preferably higher than 10:1, more preferably higher than 20:1, most preferably higher than 30:1, particularly higher than 50:1, especially higher than 75:1, for example higher than 100:1.

The CMP composition (Q) comprises the components (A), (B), (C) and (D) as described below.

The CMP composition (Q) comprises inorganic particles, organic particles, or a mixture or composite thereof (A). (A) can be
- of one type of inorganic particles,
- a mixture or composite of different types of inorganic particles,
- of one type of organic particles,
- a mixture or composite of different types of organic particles, or
- a mixture or composite of one or more types of inorganic particles and one or more types of organic particles.

A composite is a composite particle comprising two or more types of particles in such a way that they are mechanically, chemically or in another way bound to each other. An example for a composite is a core-shell particle comprising one type of particle in the outer sphere (shell) and another type of particle in the inner sphere (core).

Generally, the particles (A) can be contained in varying amounts in the CMP composition (Q). Preferably, the amount of (A) is not more than 10 wt. % (wt. % stands for "percent by weight"), more preferably not more than 5 wt. %, most preferably not more than 2.5 wt. %, for example not more than 1.8 wt. %, based on the total weight of the composition (Q). Preferably, the amount of (A) is at least 0.002 wt. %, more preferably at least 0.01 wt. %, most preferably at least 0.08 wt. %, for example at least 0.4 wt. %, based on the total weight of the composition (Q).

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the $d_{50}$ value of the particle size distribution of (A) in the aqueous medium (D) and can be determined using dynamic light scattering techniques. Then, the $d_{50}$ values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles (A) is in the range of from 5 to 500 nm, more preferably in the range of from 5 to 250 nm, most preferably in the range of from 20 to 150 nm, and in particular in the range of from 35 to 130 nm, as measured with dynamic light scattering techniques using instruments such as High Performance Particle Sizer (HPPS) from Malvern Instruments, Ltd. or Horiba LB550.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with chamfered edges, octahedrons, icosahedrons, nodules or spheres with or without protrusions or indentations. Preferably, they are spherical with no or only very few protrusions or indentations.

The chemical nature of particles (A) is not particularly limited. (A) may be of the same chemical nature or a mixture or composite of particles of different chemical nature. As a rule, particles (A) of the same chemical nature are preferred. Generally, (A) can be
- inorganic particles such as a metal, a metal oxide or carbide, including a metalloid, a metalloid oxide or carbide, or
- organic particles such as polymer particles,
- a mixture or composite of inorganic and organic particles.

Particles (A) are preferably inorganic particles. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titanium, titanium carbide, tungsten oxide, yttrium oxide, zirconia, or mixtures or composites thereof. Most preferably, particles (A) are alumina, ceria, silica, titanium, zirconia, or mixtures or composites thereof. In particular (A) are silica particles.

For example (A) are colloidal silica particles. Typically, colloidal silica particles are produced by a wet precipitation process.

In another embodiment in which (A) are organic particles, or a mixture or composite of inorganic and organic particles, polymer particles are preferred as organic particles. Polymer particles can be homo- or copolymers. The latter may for example be block-copolymers, or statistical copolymers. The homo- or copolymers may have various structures, for instance linear, branched, comb-like, dendrimeric, entangled or cross-linked. The polymer particles may be obtained according to the anionic, cationic, controlled radical, free radical mechanism and by the process of suspension or emulsion polymerisation. Preferably, the polymer particles are at least one of the polystyrenes, polyesters, alkyd resins, polyurethanes, polylactones, polycarbonates, poylacrylates, polymethacrylates, polyethers, poly(N-alkylacrylamide)s, poly(methyl vinyl ether)s, or copolymers comprising at least one of vinylaromatic compounds, acrylates, methacrylates, maleic anhydride acrylamides, methacrylamides, acrylic acid, or methacrylic acid as monomeric units, or mixtures or composites thereof. Among them, polymer particles with a cross-linked structure are preferred.

The CMP composition (Q) comprises at least one type of oxidizing agent (B), preferably one to two types of oxidizing agent (B), more preferably one type of oxidizing agent (B). In general, the oxidizing agent is a compound which is capable of oxidizing the to-be-polished substrate or one of its layers. Preferably, (B) is a per-type oxidizer. More preferably, (B) is a peroxide, persulfate, perchlorate, perbromate, periodate, permanganate, or a derivative thereof. Most preferably, (B) is a peroxide or persulfate. Particularly, (B) is a peroxide. For example, (B) is hydrogen peroxide.

The oxidizing agent (B) can be contained in varying amounts in the CMP composition (Q). Preferably, the amount of (B) is not more than 20 wt. %, more preferably not more than 10 wt. %, most preferably not more than 5 wt. %, particularly not more than 3.5 wt. %, for example not more than 2.7 wt. %, based on the total weight of the composition (Q). Preferably, the amount of (B) is at least 0.01 wt. %, more preferably at least 0.08 wt. %, most preferably at least 0.4 wt. %, particularly at least 0.75 wt. %, for example at least 1 wt. %, based on the total weight of the composition (Q). If hydrogen peroxide is used as oxidizing agent (B), the amount of (B) is for instance 2.5 wt. %, based on the total weight of the composition (Q).

The CMP composition (Q) comprises at least one type of organic compound (C) which comprises at least {k} moieties (Z), but excluding salts (S) whose anions are inorganic and whose only organic cation is $[NR^{11}R^{12}R^{13}R^{14}]^+$. Preferably, the CMP composition (Q) comprises one to two types of such organic compound (C), more preferably one type of such organic compound (C).

The excluded salts (S) are salts whose anions are inorganic and whose only organic cation is $[NR^{11}R^{12}R^{13}R^{14}]^+$, wherein
$R^{11}$, $R^{12}$, $R^{13}$ is—independently from each other—H, alkyl, aryl, alkylaryl, or arylalkyl, and $R^{11}$, $R^{12}$, $R^{13}$ does not comprise any moiety (Z),
$R^{14}$ is alkyl, aryl, alkylaryl, or arylalkyl, and $R^{14}$ does not comprise any moiety (Z).

Examples for excluded salts (S) are tetramethylammonium hydroxide and tetramethylammonium carbonate.

The term "organic" in "organic compound" and "organic cation" means a compound whose molecules contain at least one carbon atom, except inorganic carbon-containing compounds which are:

allotropes of carbon such as diamond, graphite and fullerene,
carbon-containing alloys, or carbides,
compounds whose carbon atom or atoms are all included in
neutral molecules, ligands, or anions consisting only of
(i1) at least one carbon atom and at least one atom of at least one Group 15, 16 and/or 17 element,
(i2) hydrogen carbonate, carbonic acid, hydrogen thiocarbonate, or thiocarbonic acid, or
(i3) HCN, $H_2NCN$, HOCN, HSCN, or isomers thereof;

Examples for inorganic carbon-containing compounds (i1) are CO, $Ni(CO)_4$, $CO_2$, $Na_2CO_3$, $K_2CO_3$, $(NH_4)_2CO_3$, COS, $CS_2$, $(CN)_2$, BrCN, NaCN, KCN, Na(OCN), K(SCN), $CCl_4$, $COF_2$, etc. Examples for inorganic carbon-containing compounds (i2) are $NaHCO_3$, $KHCO_3$, $(NH_4)HCO_3$, etc.

Any compound, including any cation or anion, which is not "organic" according to the above definition is "inorganic".

{k}, the minimum number of moieties (Z) comprised in the compound (C), is 1, preferably 2, more preferably 3.

The moiety (Z) comprised in the organic compound (C) is a hydroxyl (—OH), alkoxy (—$OR^1$), heterocyclic alkoxy (—$OR^1$ as part of a heterocyclic structure), carboxylic acid (—COOH), carboxylate (—$COOR^2$), amino (—$NR^3R^4$), heterocyclic amino (—$NR^3R^4$ as part of a heterocyclic structure), imino (=N—$R^5$ or —N=$R^6$), heterocyclic imino (=N—$R^5$ or —N=$R^6$ as part of a heterocyclic structure), phosphonate (—P(=O)($OR^7$)($OR^8$)), phosphate (—O—P(=O)($OR^9$)($OR^{10}$)), phosphonic acid (—P(=O)(OH)$_2$), phosphoric acid (—O—P(=O)(OH)$_2$) moiety, or their protonated or deprotonated forms, wherein
$R^1$, $R^2$, $R^7$, $R^9$ is—independently from each other—alkyl, aryl, alkylaryl, or arylalkyl,
$R^3$, $R^4$, $R^5$, $R^8$, $R^{10}$ is—independently from each other—H, alkyl, aryl, alkylaryl, or arylalkyl,
$R^6$ is alkylene, or arylalkylene.

Preferably, the moiety (Z) comprised in the organic compound (C) is a hydroxyl (—OH), alkoxy ($OR^1$), heterocyclic alkoxy (—$OR^1$ as part of a heterocyclic structure), carboxylic acid (—COOH), amino (—$NR^3R^4$), heterocyclic amino (—$NR^3R^4$ as part of a heterocyclic structure), imino (=N—$R^5$ or —N=$R^6$), heterocyclic imino (=N—$R^5$ or —N=$R^6$ as part of a heterocyclic structure) moiety, or their protonated or deprotonated forms, wherein
$R^1$, $R^2$, $R^7$, $R^9$ is—independently from each other—alkyl, aryl, alkylaryl, or arylalkyl,
$R^3$, $R^4$, $R^5$, $R^8$, $R^{10}$ is—independently from each other—H, alkyl, aryl, alkylaryl, or arylalkyl,
$R^6$ is alkylene, or arylalkylene.

If the moiety (Z) is a heterocyclic alkoxy or a heterocyclic imino moiety, the term "as part of a heterocyclic structure" means that the corresponding moiety (Z) is located within a heterocyclic structure of compound (C) in such a way that the corresponding substituent $R^1$, $R^5$, $R^6$ is bonded—directly, or indirectly via further moieties—again to the same moiety (Z). If the moiety (Z) is a heterocyclic imino moiety and if the heterocyclic structure has an aromatic character, it might be not possible to distinguish between =N—$R^5$ and —N=$R^6$ due to the aromatic character. If the moiety (Z) is a heterocyclic amino moiety, the term "as part of a heterocyclic structure" means that the corresponding moiety (Z) is located within a heterocyclic structure of compound (C) in such a way that at least one of the corresponding substituents $R^3$ or $R^4$ is bonded—directly, or indirectly via further moieties—again to the same moiety (Z).

A heterocyclic compound or structure is a compound or structure which has atoms of at least two different elements as ring member atoms.

If the substituents $R^1$, $R^2$, $R^3$, $R^4$, $R^5$, $R^6$, $R^7$, $R^8$, $R^9$, or $R^{10}$ would comprise—within themselves—one or more moieties (Z) which are here referred to as (Z'), only the part of the corresponding substituent excluding (Z') would be considered as $R^1$, $R^2$, $R^3$, $R^4$, $R^5$, $R^6$, $R^7$, $R^8$, $R^9$, or $R^{10}$.

$R^1$ can generally be any substituted or unsubstituted alkyl, aryl, alkylaryl, or arylalkyl group. $R^1$ is preferably substituted or unsubstituted alkyl, more preferably unsubstituted alkyl group. Most preferably, $R^1$ is $C_1$ to $C_{12}$ alkyl, particularly $C_1$ to $C_6$ alkyl group.

$R^2$ can generally be any substituted or unsubstituted alkyl, aryl, alkylaryl, or arylalkyl group. $R^2$ is preferably substituted or unsubstituted alkyl, more preferably unsubstituted alkyl group. Most preferably, $R^2$ is $C_1$ to $C_{12}$ alkyl, particularly $C_1$ to $C_6$ alkyl group.

$R^3$ can generally be H or any substituted or unsubstituted alkyl, aryl, alkylaryl, or arylalkyl group. $R^3$ is preferably H or substituted or unsubstituted alkyl group, more preferably H or unsubstituted alkyl group. Most preferably, $R^3$ is H or a $C_1$ to $C_{12}$ alkyl group, particularly H or a $C_1$ to $C_6$ alkyl group, for example H.

$R^4$ can generally be H or any substituted or unsubstituted alkyl, aryl, alkylaryl, or arylalkyl group. $R^4$ is preferably H or substituted or unsubstituted alkyl group, more preferably H or unsubstituted alkyl group. Most preferably, $R^4$ is H or a $C_1$ to $C_{12}$ alkyl group, particularly H or a $C_1$ to $C_6$ alkyl group, for example H.

$R^5$ can generally be H or any substituted or unsubstituted alkyl, aryl, alkylaryl, or arylalkyl group. $R^5$ is preferably H or substituted or unsubstituted alkyl group, more preferably H or unsubstituted alkyl group. Most preferably, $R^5$ is H or a $C_1$ to $C_{12}$ alkyl group, particularly H or a $C_1$ to $C_6$ alkyl group, for example H.

$R^6$ can generally be any substituted or unsubstituted alkylene, or arylalkylene group. $R^6$ is preferably substituted or unsubstituted alkylene, more preferably unsubstituted alkylene group. Most preferably, $R^6$ is $C_1$ to $C_{12}$ alkylene, particularly $C_1$ to $C_6$ alkylene group.

$R^7$ can generally be any substituted or unsubstituted alkyl, aryl, alkylaryl, or arylalkyl group. $R^7$ is preferably substituted or unsubstituted alkyl, more preferably unsubstituted alkyl group. Most preferably, $R^7$ is $C_1$ to $C_{12}$ alkyl, particularly $C_1$ to $C_6$ alkyl group.

$R^8$ can generally be H or any substituted or unsubstituted alkyl, aryl, alkylaryl, or arylalkyl group. $R^8$ is preferably H or substituted or unsubstituted alkyl group, more preferably H or unsubstituted alkyl group. Most preferably, $R^8$ is H or a $C_1$ to $C_{12}$ alkyl group, particularly H or a $C_1$ to $C_6$ alkyl group, for example H.

$R^9$ can generally be any substituted or unsubstituted alkyl, aryl, alkylaryl, or arylalkyl group. $R^9$ is preferably substituted or unsubstituted alkyl, more preferably unsubstituted alkyl group. Most preferably, $R^9$ is $C_1$ to $C_{12}$ alkyl, particularly $C_1$ to $C_6$ alkyl group.

$R^{10}$ can generally be H or any substituted or unsubstituted alkyl, aryl, alkylaryl, or arylalkyl group. $R^{10}$ is preferably H or substituted or unsubstituted alkyl group, more preferably H or unsubstituted alkyl group. Most preferably, $R^{10}$ is H or a $C_1$ to $C_{12}$ alkyl group, particularly H or a $C_1$ to $C_6$ alkyl group, for example H.

In general, the organic compound (C) can be contained in varying amounts. Preferably, the amount of (C) is not more than 5 wt. %, more preferably not more than 2 wt. %, most preferably not more than 0.5 wt. %, particularly not more than 0.25 wt. %, for example not more than 1 wt. %, based on the total weight of the composition (Q). Preferably, the amount of (C) is at least 0.0001 wt. %, more preferably at least 0.001 wt. %, most preferably at least 0.005 wt. %, particularly at least 0.01 wt. %, for example at least 0.05 wt. %, based on the total weight of the composition (Q).

In general, the organic compound (C) can have different weight average molecular weights. The weight average molecular weight of (C) is preferably at least 50, more preferably at least 100, most preferably at least 150, particularly at least 200, for example at least 250. The weight average molecular weight of (B) is preferably not more than 25,000, more preferably not more than 5,000, most preferably not more than 1,000, particularly not more than 700, for example not more than 400. In case of compounds with a high weight average molecular weight, the weight average molecular weight can be determined by standard gel permeation chromatography (GPC) techniques known to the person skilled of the art. In case of compounds with a low weight average molecular weight, the weight average molecular weight can be determined by mass spectrometry (MS) techniques known to the person skilled of the art.

In general, the solubility of organic compound (C) in an aqueous medium can vary within a wide range. The solubility of (C) in water at pH 7 at 25° C. under atmospheric pressure is preferably at least 1 g/L, more preferably at least 5 g/L, most preferably at least 20 g/L, particularly at least 50 g/L, for example at least 150 g/L. Said solubility can be determined by evaporating the solvent and measuring the remaining mass in the saturated solution.

In one embodiment, the organic compound (C) is preferably an organic compound comprising at least {k} moieties (Z), but excluding salts (S) whose anions are inorganic and whose only organic cation is $[NR^{11}R^{12}R^{13}R^{14}]^+$, wherein {k} is 2 and wherein (Z) is a hydroxyl (—OH), alkoxy ($OR^1$), heterocyclic alkoxy (—$OR^1$ as part of a heterocyclic structure), carboxylic acid (—COOH), amino (—$NR^3R^4$), heterocyclic amino (—$NR^3R^4$ as part of a heterocyclic structure), imino (=N—$R^5$ or —N=$R^6$), heterocyclic imino (=N—$R^5$ or —N=$R^6$ as part of a heterocyclic structure) moiety, or their protonated or deprotonated forms.

In a further embodiment, the organic compound (C) is preferably an organic compound comprising at least {k} moieties (Z), but excluding salts (S) whose anions are inorganic and whose only organic cation is $[NR^{11}R^{12}R^{13}R^{14}]^+$, wherein {k} is 3 and wherein (Z) is a hydroxyl (—OH), alkoxy ($OR^1$), heterocyclic alkoxy (—$OR^1$ as part of a heterocyclic structure), carboxylic acid (—COOH), amino (—$NR^3R^4$), heterocyclic amino (—$NR^3R^4$ as part of a heterocyclic structure), imino (=N—$R^5$ or —N=$R^6$), heterocyclic imino (=N—$R^5$ or —N=$R^6$ as part of a heterocyclic structure) moiety, or their protonated or deprotonated forms.

In a further embodiment, the organic compound (C) is preferably an organic compound comprising at least {k} moieties (Z), but excluding salts (S) whose anions are inorganic and whose only organic cation is $[NR^{11}R^{12}R^{13}R^{14}]^+$, wherein {k} is 3 and wherein (Z) is a hydroxyl (—OH), alkoxy ($OR^1$), heterocyclic alkoxy (—$OR^1$ as part of a heterocyclic structure), carboxylic acid (—COOH), amino (—$NR^3R^4$), heterocyclic amino (—$NR^3R^4$ as part of a heterocyclic structure), imino (=N—$R^5$ or —N=$R^6$), heterocyclic imino (=N—R⁵ or —N=R⁶ as part of a heterocyclic structure) moiety, or their protonated or deprotonated forms, and wherein at least one (Z) moiety is an amino (—NR³R⁴), heterocyclic amino (—NR³R⁴ as part of a heterocyclic structure), imino (=N—R⁵ or —N=R⁶), heterocyclic imino (=N—R⁵ or —N=R⁶ as part of a heterocyclic structure) moiety, or their protonated or deprotonated forms, and wherein at least one (Z) moiety is a hydroxyl (—OH), alkoxy (OR¹), heterocyclic alkoxy (—OR¹ as part of a heterocyclic structure) moiety, or their protonated or deprotonated forms.

In a further embodiment, the organic compound (C) is preferably an organic compound comprising at least {k} moieties (Z), but excluding salts (S) whose anions are inorganic and whose only organic cation is [NR¹¹R¹²R¹³R¹⁴]⁺, wherein {k} is 3 and wherein (Z) is a hydroxyl (—OH), alkoxy (OR¹), heterocyclic alkoxy (—OR¹ as part of a heterocyclic structure), carboxylic acid (—COOH), amino (—NR³R⁴), heterocyclic amino (—NR³R⁴ as part of a heterocyclic structure), imino (=N—R⁵ or —N=R⁶), heterocyclic imino (=N—R⁵ or —N=R⁶ as part of a heterocyclic structure) moiety, or their protonated or deprotonated forms, and wherein at least two (Z) moieties are selected from the group consisting of an amino (—NR³R⁴), heterocyclic amino (—NR³R⁴ as part of a heterocyclic structure), imino (=N—R⁵ or —N=R⁶), heterocyclic imino (=N—R⁵ or —N=R⁶ as part of a heterocyclic structure) moiety, or their protonated or deprotonated forms, and wherein at least one (Z) moiety is a hydroxyl (—OH), alkoxy (OR¹), heterocyclic alkoxy (—OR¹ as part of a heterocyclic structure) moiety, or their protonated or deprotonated forms.

In a further embodiment, the organic compound (C) is preferably an organic compound comprising at least {k} moieties (Z), but excluding salts (S) whose anions are inorganic and whose only organic cation is [NR¹¹R¹²R¹³R¹⁴]⁺, wherein {k} is 3 and wherein (Z) is a hydroxyl (—OH), alkoxy (OR¹), heterocyclic alkoxy (—OR¹ as part of a heterocyclic structure), carboxylic acid (—COOH), amino (—NR³R⁴), heterocyclic amino (—NR³R⁴ as part of a heterocyclic structure), imino (=N—R⁵ or —N=R⁶), heterocyclic imino (=N—R⁵ or —N=R⁶ as part of a heterocyclic structure) moiety, or their protonated or deprotonated forms, and wherein at least one (Z) moiety is an amino (—NR³R⁴), heterocyclic amino (—NR³R⁴ as part of a heterocyclic structure), imino (=N—R⁵ or —N=R⁶), heterocyclic imino (=N—R⁵ or —N=R⁶ as part of a heterocyclic structure) moiety, or their protonated or deprotonated forms, and wherein at least two (Z) moieties are selected from the group consisting of a hydroxyl (—OH), alkoxy (OR¹), heterocyclic alkoxy (—OR¹ as part of a heterocyclic structure) moiety, or their protonated or deprotonated forms.

In a further embodiment, the organic compound (C) is preferably an amino carboxylic acid, or a salt thereof, more preferably an alpha-amino acid, or a salt thereof, most preferably a proteinogenic alpha-amino acid, or a salt thereof, particularly serine, arginine, lysine, histidine, or a salt thereof, for example histidine, or a salt thereof.

In a further embodiment, the organic compound (C) is preferably an organic compound comprising at least two carboxylic acid (—COOH) groups, or a salt thereof, more preferably an organic compound comprising from two to five carboxylic acid (—COOH) groups, or a salt thereof, most preferably an organic compound comprising from two to three carboxylic acid (—COOH) groups, or a salt thereof, particularly malonic acid, citric acid, tartaric acid, or a salt thereof, for example tartaric acid, or a salt thereof.

In a further embodiment, the organic compound (C) is preferably an amino alcohol, an amino ether, or a salt thereof. Here, an amino ether comprising at least one hydroxyl moiety is considered as a type of amino ether. If (C) is an amino alcohol, or a salt thereof, (C) is more preferably a mono-, di-, trialkanolamine, or a salt thereof, most preferably a monoalkanolamine, or a salt thereof, particularly a C₂ to C₈ monoalkanolamine, or a salt thereof, for example monoethanolamine, or a salt thereof. If (C) is an amino ether, or a salt thereof, (C) is more preferably an amino ether comprising a further amino, hydroxyl, alkoxy, carboxyl moiety, or a salt thereof, most preferably a bis (aminoalkyl) ether, an aminoalkyl hydroxyalkyl ether, an aminoalkyl alkoxyalkyl ether, or a salt thereof, particularly an bis(aminoalkyl) ether, for example bis(N,N-dimethylaminoethyl)ether.

If the organic compound (C) is an amino alcohol, an amino ether, or a salt thereof, the organic compound (C) is particularly
dimethylaminoethoxyethanol,
bis(N,N-dimethylaminoethyl)ether,
2-methoxyethylamine,
2-dimethylamino-2-methyl-1-propanol,
3-amino-1-propanol,
N,N-Di(2-hydroxyethyl)aniline,
1-(2-hydroxyethyl)piperazine,
monoethanolamine,
diethanolamine,
triethanolamine,
or a salt thereof, or a salt or adduct of triethanolamine (=2,2',2''-nitrilotris(ethanol)) and 4-[(2-ethylhexyl)amino]-4-oxoisocrotonic acid.

In a further embodiment, the organic compound (C) is preferably an organic compound comprising at least two hydroxyl (—OH) groups, or a salt thereof, more preferably an organic compound comprising two to four hydroxyl (—OH) groups, or a salt thereof, most preferably a diol, or a salt thereof, particularly ethylene glycol, 2-butyne-1,4-diol, or a salt thereof, for example 2-butyne-1,4-diol.

In a further embodiment, the organic compound (C) is preferably a nitrogen-containing heterocyclic compound, or a salt thereof, more preferably a heterocyclic compound comprising a 5- or 6-membered ring having one to three nitrogen atoms as ring members atom, or a salt thereof, most preferably imidazole, benzimidazole, vinylimidazole, pyridine, 1,2,4-triazole, benzotriazole, piperazine, or a derivative thereof, or a salt thereof, particularly imidazole, vinylimidazole, pyridine, piperazine, or a derivative thereof, or a salt thereof, for example imidazole, or a derivative thereof, or a salt thereof.

In a further embodiment, the organic compound (C) is preferably

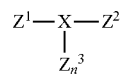

wherein n is zero (0), when X is oxygen and one (1), when X is nitrogen, and $Z^1$, $Z^2$ and $Z^3$ are independently from each other hydrogen, $C_1$- to $C_8$-alkyl, primary, secondary or tertiary $C_2$- to $C_8$-hydroxyalkyl, secondary or tertiary $C_3$- to $C_8$-aminoalkyl, wherein the amino nitrogen may form a carboxyclic or heterocarbocyclic unsaturated or saturated 5- or 6-membered ring, wherein the hetero atom is oxygen or nitrogen and the heteroatoms are not adjacent to each other, optionally substituted on one or more carbon atoms with $C_2$- to $C_8$-hydroxyalkyl, $C_3$- to $C_8$-alkoxyalkyl, $C_3$- to $C_8$-carboxyalkyl, $C_2$- to $C_8$-amino optionally substituted by primary, secondary or tertiary $C_2$- to $C_4$-hydroxyalkyl optionally substituted by one or more amino groups, $C_3$- to $C_8$-carboxyalkyl, hydrogen, primary, secondary or tertiary $C_2$- to $C_8$-hydroxyalkyl, $C_2$- to $C_8$-amino optionally substituted by primary, secondary or tertiary $C_2$- to $C_4$-hydroxyalkyl.

$Z^1$ and $Z^2$ forming a carboxyclic or heterocarbocyclic unsaturated or saturated 5- or 6-membered ring, wherein the hetero atom is oxygen or nitrogen, their number is 1 or 2, and the heteroatoms are not adjacent to each other, optionally substituted on one or more carbon atoms with $C_2$- to $C_8$-hydroxyalkyl, $C_3$- to $C_8$-alkoxyalkyl, $C_3$- to $C_8$-carboxyalkyl, $C_2$- to $C_8$-aminoalkyl, optionally substituted by $C_1$- to $C_4$-alkyl, $C_2$- to $C_8$-amino optionally substituted by primary, secondary or tertiary $C_2$- to $C_4$-hydroxyalkyl optionally substituted by one or more amino groups, and $Z^3$ is hydrogen, $C_1$- to $C_8$-alkyl, $C_2$- to $C_8$-alkenyl or $C_2$- to $C_8$-alkinyl, or a salt thereof, with the proviso that $Z^1$, $Z^2$ and $Z^3$ are not identical and hydrogen, $C_1$- to $C_8$-alkyl or combinations thereof.

Preferred compounds (C) are tri-iso-propanolamine, monoethanolamine, diethanolamine, triethanolamine, 3-amino-1-propanol, N,N,N',N'-tetrakis(2-hydroxypropyl) ethylenediamine, hydroxyethylpiperazine, 4-(2-hydroxyethyl)morpholine, 2-dimethylamino-2-methyl-1-propanol, bis-(2-dimethylaminoethyl)ether, pentamethyldiethylenetriamine, 2,2'-dimorpholinodiethylether, 1,3,5-tris[3-(dimethylamino)propyl]hexahydro-1,3,5-triazine, dimethylaminoethoxyethanol, imidazole, N-(3-aminopropyl)imidazole, 1-vinylimidazole, 2-amino-3(1H-imidazol-4-yl)propanoic acid (histidine).

According to the invention, the CMP composition (Q) contains an aqueous medium (D). (D) can be of one type or a mixture of different types of aqueous media.

In general, the aqueous medium (D) can be any medium which contains water. Preferably, the aqueous medium (D) is a mixture of water and an organic solvent miscible with water (e.g. an alcohol, preferably a $C_1$ to $C_3$ alcohol, or an alkylene glycol derivative). More preferably, the aqueous medium (D) is water. Most preferably, aqueous medium (D) is de-ionized water.

If the amounts of the components other than (D) are in total y % by weight of the CMP composition, then the amount of (D) is (100−y) % by weight of the CMP composition.

The CMP composition (Q) can further optionally contain at least one biocide (E), for example one biocide. In general, the biocide is a compound which deters, renders harmless, or exerts a controlling effect on any harmful organism by chemical or biological means. Preferably, (E) is an quaternary ammonium compound, an isothiazolinone-based compound, an N-substituted diazenium dioxide, or an N'-hydroxy-diazenium oxide salt. More preferably, (E) is an N-substituted diazenium dioxide, or an N'-hydroxy-diazenium oxide salt If present, the biocide (E) can be contained in varying amounts. If present, the amount of (E) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding composition. If present, the amount of (E) is preferably at least 0.0001 wt. %, more preferably at least 0.0005 wt. %, most preferably at least 0.001 wt. %, particularly at least 0.003 wt. %, for example at least 0.006 wt. %, based on the total weight of the corresponding composition.

The CMP composition (Q) can contain further optionally contain at least one corrosion inhibitor (F), for example two corrosion inhibitors. In general, all compounds forming a protective molecular layer on the surface of Ge and/or germanium oxide can be used as corrosion inhibitor. Preferred corrosion inhibitors are thiols, film forming polymers, polyols, diazoles, triazoles, tetrazoles, and their derivatives, for example benzotriazole or tolyltriazole.

If present, the corrosion inhibitor (F) can be contained in varying amounts. If present, the amount of (F) is preferably not more than 10 wt. %, more preferably not more than 2 wt. %, most preferably not more than 0.5 wt. %, particularly not more than 0.1 wt. %, for example not more than 0.05 wt. %, based on the total weight of the corresponding composition. If present, the amount of (F) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding composition.

The properties of the CMP composition (Q), such as stability and polishing performance, may depend on the pH of the corresponding composition. Preferably, the pH value of the composition (Q) is in the range of from 1.5 to 6.5, more preferably from 2.5 to 5.5, most preferably from 3 to 5, particularly from 3.5 to 4.5, for example from 3.8 to 4.2.

The CMP composition (Q) can contain further optionally contain at least one pH adjusting agent (G). In general, the pH adjusting agent (G) is a compound which is added to the CMP composition (Q) to have its pH value adjusted to the required value. Preferably, the CMP composition (Q) contains at least one pH adjusting agent (G). Preferred pH adjusting agents are inorganic acids, carboxylic acids, amine bases, alkali hydroxides, ammonium hydroxides, including tetraalkylammonium hydroxides. For example, the pH adjusting agent (G) is nitric acid, sulfuric acid, ammonia, sodium hydroxide, or potassium hydroxide.

If present, the pH adjusting agent (G) can be contained in varying amounts. If present, the amount of (G) is preferably not more than 10 wt. %, more preferably not more than 2 wt. %, most preferably not more than 0.5 wt. %, particularly not more than 0.1 wt. %, for example not more than 0.05 wt. %, based on the total weight of the corresponding composition. If present, the amount of (G) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding composition.

The CMP composition (Q) may also contain, if necessary, various other additives, including but not limited to stabilizers, surfactants, friction reducing agents, etc. Said other additives are for instance those commonly employed in CMP compositions and thus known to the person skilled in the art. Such addition can for example stabilize the dispersion, or improve the polishing performance, or the selectivity between different layers.

If present, said other additive can be contained in varying amounts. Preferably, the total amount of said other additives is not more than 10 wt. %, more preferably not more than 2 wt. %, most preferably not more than 0.5 wt. %, particularly not more than 0.1 wt. %, for example not more than 0.01 wt. %, based on the total weight of the corresponding CMP composition. Preferably, the total amount of said other additives is at least 0.0001 wt. %, more preferably at least 0.001 wt. %, most preferably at least 0.008 wt. %, particularly at least 0.05 wt. %, for example at least 0.3 wt. %, based on the total weight of the corresponding composition.

According to one preferred embodiment, a process for the manufacture of semiconductor devices comprising the chemical mechanical polishing of elemental germanium and/or $Si_{1-x}Ge_x$ material with $0.1 \leq x < 1$ was carried out in the presence of a CMP composition having a pH value of 2.5 to 5.5 and comprising
(A) silica particles, in an amount of from 0.01 to 5 wt. % by weight of the CMP composition,
(B) hydrogen peroxide, in an amount of from 0.4 to 5 wt. % by weight of the CMP composition,
(C) at least one type of an organic compound which comprises at least two moieties (Z), but excluding salts (S) whose anions are inorganic and whose only organic cation is $[NR^{11}R^{12}R^{13}R^{14}]^+$, in an amount of from 0.001 to 2 wt. % by weight of the CMP composition, wherein
(Z) is a hydroxyl (—OH), alkoxy (OR$^1$), heterocyclic alkoxy (—OR$^1$ as part of a heterocyclic structure), carboxylic acid (—COOH), amino (—NR$^3$R$^4$), heterocyclic amino (—NR$^3$R$^4$ as part of a heterocyclic structure), imino (=N—R$^5$ or —N=R$^6$), heterocyclic imino (=N—R$^5$ or —N=R$^6$ as part of a heterocyclic structure) moiety, or their protonated or deprotonated forms,
R$^1$ is alkyl, aryl, alkylaryl, or arylalkyl
R$^3$, R$^4$, R$^5$ is—independently from each other—H, alkyl, aryl, alkylaryl, or arylalkyl,
R$^6$ is alkylene, or arylalkylene,
R$^{11}$, R$^{12}$, R$^{13}$ is—independently from each other—H, alkyl, aryl, alkylaryl, or arylalkyl, and R$^{11}$, R$^{12}$, R$^{13}$ does not comprise any moiety (Z),
R$^{14}$ is alkyl, aryl, alkylaryl, or arylalkyl, and R$^{14}$ does not comprise any moiety (Z)
and
(D) an aqueous medium.

According to another preferred embodiment, a process for the manufacture of semiconductor devices comprising the chemical mechanical polishing of elemental germanium was carried out in the presence of a CMP composition having a pH value of 3 to 5 and comprising
(A) silica particles, in an amount of from 0.01 to 5 wt. % by weight of the CMP composition,
(B) hydrogen peroxide, in an amount of from 0.2 to 5 wt. % by weight of the CMP composition,
(C) an amino carboxylic acid or a salt thereof, in an amount of from 0.001 to 5 wt. % by weight of the CMP composition, and
(D) an aqueous medium.

According to another preferred embodiment, a process for the manufacture of semiconductor devices comprising the chemical mechanical polishing of elemental germanium was carried out in the presence of a CMP composition having a pH value of 3 to 5 and comprising
(A) silica particles, in an amount of from 0.01 to 5 wt. % by weight of the CMP composition,
(B) hydrogen peroxide, in an amount of from 0.2 to 5 wt. % by weight of the CMP composition,
(C) an organic compound comprising at least two carboxylic acid (—COOH) groups, or a salt thereof, in an amount of from 0.001 to 2 wt. % by weight of the CMP composition, and
(D) an aqueous medium.

According to another preferred embodiment, a process for the manufacture of semiconductor devices comprising the chemical mechanical polishing of elemental germanium was carried out in the presence of a CMP composition having a pH value of 3 to 5 and comprising
(A) silica particles, in an amount of from 0.01 to 5 wt. % by weight of the CMP composition,
(B) hydrogen peroxide, in an amount of from 0.2 to 5 wt. % by weight of the CMP composition,
(C) an amino alcohol, an amino ether, or a salt thereof in an amount of from 0.001 to 2 wt. % by weight of the CMP composition, and
(D) an aqueous medium.

According to another preferred embodiment, a process for the manufacture of semiconductor devices comprising the chemical mechanical polishing of elemental germanium was carried out in the presence of a CMP composition having a pH value of 3 to 5 and comprising
(A) silica particles, in an amount of from 0.01 to 5 wt. % by weight of the CMP composition,
(B) hydrogen peroxide, in an amount of from 0.2 to 5 wt. % by weight of the CMP composition,
(C) an organic compound comprising at least two hydroxyl (—OH) groups, or a salt thereof in an amount of from 0.001 to 2 wt. % by weight of the CMP composition, and
(D) an aqueous medium.

According to another preferred embodiment, a process for the manufacture of semiconductor devices comprising the chemical mechanical polishing of elemental germanium was carried out in the presence of a CMP composition having a pH value of 3 to 5 and comprising
(A) silica particles, in an amount of from 0.01 to 5 wt. % by weight of the CMP composition,
(B) hydrogen peroxide, in an amount of from 0.2 to 5 wt. % by weight of the CMP composition,
(C) a nitrogen-containing heterocyclic compound comprising at least two hydroxyl (—OH) groups, or a salt thereof in an amount of from 0.001 to 2 wt. % by weight of the CMP composition, and
(D) an aqueous medium.

Processes for preparing CMP compositions are generally known. These processes may be applied to the preparation of the CMP composition (Q). This can be carried out by dispersing or dissolving the above-described components (A), (B), and (C) in the aqueous medium (D), preferably water, and optionally by adjusting the pH value through adding an acid, a base, a buffer or an pH adjusting agent. For this purpose the customary and standard mixing processes and mixing apparatuses such as agitated vessels, high shear impellers, ultrasonic mixers, homogenizer nozzles or counter-flow mixers, can be used.

The CMP composition (Q) is preferably prepared by dispersing the particles (A), dispersing and/or dissolving the oxidizing agent (B), the organic compound (C) and optionally other additives in the aqueous medium (D).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention, the CMP composition (Q) is usually applied onto the polishing pad as a continuous stream or in drop-wise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

For further details reference is made to WO 2004/063301 A1, in particular page 16, paragraph [0036] to page 18, paragraph [0040] in conjunction with the FIG. 2.

By way of the CMP process of the invention, wafers with integrated circuits comprising a dielectric layer can be obtained which have an excellent functionality.

The CMP composition (Q) can be used in the CMP process as ready-to-use slurry, they have a long shelf-life and show a stable particle size distribution over long time. Thus, they are easy to handle and to store. They show an excellent polishing performance, particularly with regard to the combination of high germanium and/or $Si_{1-x}Ge_x$ MRR and high Ge and/or $Si_{1-x}Ge_x$:$SiO_2$ selectivity and/or the combination of high germanium and/or $Si_{1-x}Ge_x$ MRR and low germanium and/or $Si_{1-x}Ge_x$ SER. Since the amounts of its components are held down to a minimum, the CMP composition (Q) and the CMP process according to the invention can be used or applied in a cost-effective way.

EXAMPLES AND COMPARATIVE EXAMPLES

The pH value is measured with a pH electrode (Schott, blue line, pH 0-14/−5 . . . 100° C./3 mol/L sodium chloride).

Ge-cSER (cold static etching rate of a germanium layer) is determined by dipping 1×1 inch germanium coupon into the corresponding composition for 5 minutes at 25° C. and measuring the loss of mass before and after the dipping.

Ge-hSER (hot static etching rate of a germanium layer) is determined by dipping 1×1 inch germanium coupon into the corresponding composition for 5 minutes at 60° C. and measuring the loss of mass before and after the dipping.

$Si_{1-x}Ge_x$-cSER (cold static etching rate of a $Si_{1-x}Ge_x$ layer) is determined by dipping 1×1 inch germanium coupon into the corresponding composition for 5 minutes at 25° C. and measuring the loss of mass before and after the dipping.

$Si_{1-x}Ge_x$-hSER (hot static etching rate of a $Si_{1-x}Ge_x$ layer) is determined by dipping 1×1 inch germanium coupon into the corresponding composition for 5 minutes at 60° C. and measuring the loss of mass before and after the dipping.

Inorganic Particles (A) Used in the Examples

Silica particles used as particles (A) are of NexSil™ (Nyacol) type, which are potassium-stabilized colloidal silica having a typical particle size of 5 to 250 nm and a typical surface area of 20 to 500 m$^2$/g. (A1) is NexSil™ 125K, which is potassium-stabilized colloidal silica having a typical particle size of 85 nm and a typical surface area of 35 m$^2$/g. However, other silica particles such as FUSO PL3, and PL3D can also be used.

Particularly well suited silica nanoparticles for the composition are stable in the pH range of 3-5. More precisely this includes silica nanoparticles with a negative zeta potential in the range of pH 3-5. Especially well suited are particles with a electrophoretic mobility above 0.3 (um/s)/(V/cm), more precisely all particles with a mobility above 0.5 (um/s)/(V/cm), especially above 2.5 (um/s)/(V/cm), for example, 3 (um/s)/(V/cm) at a pH of 4.

General Procedure for the CMP Experiments

For measuring electrophoretic mobility a standard Zetasizer Nano device from the company Malvern was used. The samples were diluted by a factor of 500 with 10 mmol/l KCl solution before measuring the mobility. The measurements were done at 23° C.

For the evaluation on benchtop polisher, the following parameters were chosen:

Powerpro 5000 Bühler. DF=40 N, Table speed 150 rpm, Platen speed 150 rpm, slurry flow 200 ml/min, 20 s conditioning, 1 min polishing time, IC1000 pad, diamond conditioner (3M).

The pad is conditioned by several sweeps, before a new type of CMP composition is used for CMP. For the determination of removal rates at least 3 wafers are polished and the data obtained from these experiments are averaged.

The CMP composition is stirred in the local supply station.

The germanium and/or $Si_{1-x}Ge_x$ material removal rates (Ge and/or $Si_{1-x}Ge_x$-MRR) for 2 inch discs polished by the CMP composition are determined by difference of weight of the coated wafers or blanket discs before and after CMP, using a Sartorius LA310 S scale. The difference of weight can be converted into the difference of film thickness since the density (5.323 g/cm$^3$ for germanium) and the density (3.827 g/cm$^3$ for $Si_{0.5}Ge_{0.5}$) and the surface area of the polished material are known. Dividing the difference of film thickness by the polishing time provides the values of the material removal rate.

The silicon oxide material removal rates (oxide MRR) for 2 inch discs polished by the CMP composition are determined by difference of weight of the coated wafers or blanket discs before and after CMP, using a Sartorius LA310 S scale. The difference of weight can be converted into the difference of film thickness since the density (2.648 g/cm$^3$ for silicon oxide) and the surface area of the polished material are known. Dividing the difference of film thickness by the polishing time provides the values of the material removal rate.

Objective to be Polished: Unstructured Germanium and/or $Si_{1-x}Ge_x$ Wafer

Standard Procedure for Slurry Preparation:

The components (A), (B) and (C)—each in the amounts as indicated in Table 1—were dispersed or dissolved in de-ionized water. pH is adjusted by adding of aqueous ammonia solution (0.1%-10%), 10% KOH solution or $HNO_3$ (0.1%-10%) to the slurry. The pH value is measured with a pH combination electrode (Schott, blue line 22 pH).

Example 1-25 (Compositions Used in the Process of the Invention) and Comparative Example V1

An aqueous dispersion containing the components as listed in Table 1 was prepared, furnishing the CMP compositions of the examples 1 to 25 and the comparative example V1.

The formulation and polishing performance data and of the CMP compositions of the examples 1 to 25 and of the comparative example V1 are given in the Table 1:

TABLE 1

CMP compositions of the examples 1 to 25 and of the comparative example V1, their pH values, Ge and/or $Si_{1-x}Ge_x$-cSER, Ge and/or $Si_{1-x}Ge_x$-hSER data as well as their Ge and/or $Si_{1-x}Ge_x$-MRR and oxide-MRR data in the process of chemical-mechanical polishing of 2" un-structured germanium wafers using these compositions, wherein the aqueous medium (D) of the CMP compositions is de-ionized water. The amounts of the components (A), (B), (C) are specified in weight percent (wt. %) by weight of the corresponding CMP composition. If the amounts of the components other than (D) are in total y % by weight of the CMP composition, then the amount of (D) is (100 − y) % by weight of the CMP composition.

|  | Comparative Example V1 | Example 1 | Example 2 | Example 3 |
| --- | --- | --- | --- | --- |
| Particles (A) | (A1) 1.5 wt. % | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % | $H_2O_2$ 2.5 wt. % |
| Organic compound (C) | — | Arginine 0.5 wt. % | Lysine 0.5 wt. % | Histidine 1 wt. % |
| pH | 4 | 4 | 4 | 4 |
| Ge-MRR [Å/min] | 859 | 1620 | 1816 | 2345 |
| Ge-cSER [Å/min] | 135 | 72 | 82 | 143 |
| Ge-hSER [Å/min] | 515 | 386 | 400 | 443 |
| Ratio Ge-MRR to Ge-hSER | 1.7 | 4.2 | 4.5 | 5.3 |
| Oxide-MRR [Å/min] | 177 | 480 | 320 | 590 |
| Ratio Ge-MRR to Oxide-MRR | 4.9 | 3.4 | 5.7 | 4.0 |

|  | Example 4 | Example 5 | Example 6 | Example 7 |
| --- | --- | --- | --- | --- |
| Particles (A) | (A1) 1.5 wt. % | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % | $H_2O_2$ 2.5 wt. % |
| Organic compound (C) | Malonic acid 0.5 wt. % | Acetic acid 0.5 wt. % | Citric acid 0.5 wt. % | Tartaric acid 0.5 wt. % |
| pH | 4 | 4 | 4 | 4 |
| Ge-MRR [Å/min] | 2396 | 1483 | 1734 | 2515 |
| Ge-cSER [Å/min] | 112 | 122 | 75 | 43 |
| Ge-hSER [Å/min] | 483 | 459 | 398 | 232 |
| Ratio Ge-MRR to Ge-hSER | 5.0 | 3.2 | 4.4 | 10.8 |
| Oxide-MRR [Å/min] | 550 | 482 | 605 | 500 |
| Ratio Ge-MRR to Oxide-MRR | 4.4 | 3.1 | 2.9 | 5.0 |

|  | Example 8 | Example 9 | Example 10 | Example 11 |
| --- | --- | --- | --- | --- |
| Particles (A) | (A1) 1.5 wt. % | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % | $H_2O_2$ 2.5 wt. % |
| Organic compound (C) | Dimethylaminoethoxy-ethanol 0.1 wt. % | Bis(2-dimethyl-aminoethyl)-ether 0.1 wt. % | 1-(2-Hydroxy-ethyl)-piperazine 0.1 wt. % | N,N-Di(2-hydroxyethyl)-aniline 0.1 wt. % |
| pH | 4 | 4 | 4 | 4 |
| Ge-MRR [Å/min] | 2468 | 2991 | 3283 | 1498 |
| Ge-cSER [Å/min] | 122 | 96 | 96 | 122 |
| Ge-hSER [Å/min] | 341 | 336 | 530 | 583 |
| Ratio Ge-MRR to Ge-hSER | 7.2 | 8.9 | 6.2 | 2.6 |
| Oxide-MRR [Å/min] | 499 | 600 | 550 | 600 |
| Ratio Ge-MRR to Oxide-MRR | 4.9 | 5.0 | 6.0 | 2.5 |

|  | Example 12 | Example 13 | Example 14 | Example 15 |
| --- | --- | --- | --- | --- |
| Particles (A) | (A1) 1.5 wt. % | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % | $H_2O_2$ 2.5 wt. % |

TABLE 1-continued

CMP compositions of the examples 1 to 25 and of the comparative example V1, their pH values, Ge and/or $Si_{1-x}Ge_x$-cSER, Ge and/or $Si_{1-x}Ge_x$-hSER data as well as their Ge and/or $Si_{1-x}Ge_x$-MRR and oxide-MRR data in the process of chemical-mechanical polishing of 2" un-structured germanium wafers using these compositions, wherein the aqueous medium (D) of the CMP compositions is de-ionized water. The amounts of the components (A), (B), (C) are specified in weight percent (wt. %) by weight of the corresponding CMP composition. If the amounts of the components other than (D) are in total y % by weight of the CMP composition, then the amount of (D) is (100 − y) % by weight of the CMP composition.

| | | | | |
|---|---|---|---|---|
| Organic compound (C) | Monoethanol-amine 0.1 wt. % | Diethanolamine 0.1 wt. % | Triethanolamine 0.1 wt. % | 3-Amino-1-propanol 0.1 wt. % |
| pH | 4 | 4 | 4 | 4 |
| Ge-MRR [Å/min] | 1328 | 1058 | 1119 | 1502 |
| Ge-cSER [Å/min] | 99 | 154 | 105 | 95 |
| Ge-hSER [Å/min] | 396 | 440 | 429 | 463 |
| Ratio Ge-MRR to Ge-hSER | 3.4 | 2.4 | 2.6 | 3.2 |
| Oxide-MRR [Å/min] | 130 | 400 | 400 | 400 |
| Ratio Ge-MRR to Oxide-MRR | 10.2 | 2.6 | 2.8 | 3.8 |

| | Example 16 | Example 17 | Example 18 |
|---|---|---|---|
| Particles (A) | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % |
| Organic compound (C) | 2-methoxy-ethylamine 0.1 wt. % | 2-dimethyl-amino-2-methyl-1-propanol 0.1 wt. % | salt or adduct of triethanolamine (=2,2',2"-nitrilotris(ethanol)) and 4-[(2-ethylhexyl)amino]-4-oxoisocrotonic acid 0.5 wt. % |
| pH | 4 | 4 | 4 |
| Ge-MRR [Å/min] | 2350 | 2820 | 1400 |
| Ge-cSER [Å/min] | — | — | — |
| Ge-hSER [Å/min] | 430 | 410 | 340 |
| Ratio Ge-MRR to Ge-hSER | 5.5 | 6.9 | 4.1 |
| Oxide-MRR [Å/min] | 500 | 750 | 550 |
| Ratio Ge-MRR to Oxide-MRR | 4.7 | 3.8 | 2.5 |

| | Example 19 | Example 20 | Example 21 | Example 22 |
|---|---|---|---|---|
| Particles (A) | (A1) 1.5 wt. % | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % | $H_2O_2$ 2.5 wt. % |
| Organic compound (C) | Korantin ® SMK (an acidic alkyl phosphate) 0.5 wt. % | Benzimidazole 0.07 wt. % | Benzotriazole 0.025 wt. % | Tolyltriazole 0.1 wt. % |
| pH | 4 | 4 | 4 | 4 |
| Ge-MRR [Å/min] | 1040 | 1999 | 1224 | 1052 |
| Ge-cSER [Å/min] | — | — | — | — |
| Ge-hSER [Å/min] | 420 | 471 | 559 | 590 |
| Ratio Ge-MRR to Ge-hSER | 2.5 | 4.2 | 2.2 | 1.8 |
| Oxide-MRR [Å/min] | 190 | 362 | 112 | 147 |
| Ratio Ge-MRR to Oxide-MRR | 5.5 | 5.5 | 10.9 | 7.2 |

| | Example 23 | Example 24 | Example 25 |
|---|---|---|---|
| Particles (A) | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % |
| Organic compound (C) | Vinylimidazole 0.1 wt. % | Imidazole 0.5 wt. % | N,N,N',N'-tetrakis-(2-hydroxy-propyl)-ethylenediamine 0.5 wt. % |
| pH | 4 | 4 | 4 |
| Ge-MRR [Å/min] | 3235 | 3321 | 1622 |
| Ge-cSER [Å/min] | — | — | — |
| Ge-hSER [Å/min] | 396 | 288 | 299 |
| Ratio Ge-MRR to Ge-hSER | 8.2 | 11.5 | 5.4 |
| Oxide-MRR [Å/min] | 1059 | 545 | 487 |
| Ratio Ge-MRR to Oxide-MRR | 3.1 | 6.1 | 3.33 |

| | Example 26 | Example 27 | Example 28 | Example 29 |
|---|---|---|---|---|
| Particles (A) | (A1) 1.5 wt. % | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % | $H_2O_2$ 2.5 wt. % |

TABLE 1-continued

CMP compositions of the examples 1 to 25 and of the comparative example V1, their pH values, Ge and/or $Si_{1-x}Ge_x$-cSER, Ge and/or $Si_{1-x}Ge_x$-hSER data as well as their Ge and/or $Si_{1-x}Ge_x$-MRR and oxide-MRR data in the process of chemical-mechanical polishing of 2" un-structured germanium wafers using these compositions, wherein the aqueous medium (D) of the CMP compositions is de-ionized water. The amounts of the components (A), (B), (C) are specified in weight percent (wt. %) by weight of the corresponding CMP composition. If the amounts of the components other than (D) are in total y % by weight of the CMP composition, then the amount of (D) is (100 − y) % by weight of the CMP composition.

| Organic compound (C) | Imidazole 0.5 wt. % | 1-(2-Hydroxyethyl)-piperazine 0.1 wt. % | Bis(2-dimethylaminoethyl)-ether 0.1 wt. % |
|---|---|---|---|
| pH | 4 | 4 | 4 | 4 |
| $Si_{0.5}Ge_{0.5}$-MRR [Å/min] | 745 | 3005 | 2955 | 2902 |
| $Si_{0.5}Ge_{0.5}$-cSER [Å/min] | — | — | | |
| $Si_{0.5}Ge_{0.5}$-hSER [Å/min] | 325 | 250 | 502 | 305 |
| Ratio $Si_{0.5}Ge_{0.5}$-MRR to $Si_{0.5}Ge_{0.5}$-hSER | 2.3 | 12.0 | 5.9 | 9.5 |
| Oxide-MRR [Å/min] | | | | |
| Ratio Ge-MRR to Oxide-MRR | | | | |

| | Example 30 | Example 31 | Example 32 |
|---|---|---|---|
| Particles (A) | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % |
| Organic compound (C) | N-(3-Aminopropyl)imidazole 0.1 wt. % | Triisopropanolamine 0.1 wt. % | 4-(2-Hydroxyethyl)morpholine 0.1 wt. % |
| pH | 4 | 4 | 4 |
| Ge-MRR [Å/min] | 3108 | 1410 | 1484 |
| Ge-cSER [Å/min] | — | — | — |
| Ge-hSER [Å/min] | 324 | 326 | 309 |
| Ratio Ge-MRR to Ge-hSER | 9.6 | 4.3 | 4.8 |
| Oxide-MRR [Å/min] | | | |
| Ratio Ge-MRR to Oxide-MRR | | | |

| | Example 33 | Example 34 | Example 35 |
|---|---|---|---|
| Particles (A) | (A1) 1.5 wt. % | (A1) 1.5 wt. % | (A1) 1.5 wt. % |
| Oxidizing agent (B) | $H_2O_2$ 2.5 wt. % | $H_2O_2$ 2.5 wt. % | $H_2O_2$ 2.5 wt. % |
| Organic compound (C) | 1,3,5-Tris[3-(dimethylamino)propyl]hexahydro-1,3,5-triazine 0.1 wt. % | Pentamethyldiethylenetriamine 0.1 wt. % | 4-Dimethylaminopyridine 0.1 wt. % |
| pH | 4 | 4 | 4 |
| Ge-MRR [Å/min] | 3321 | 2178 | 2190 |
| Ge-cSER [Å/min] | — | — | — |
| Ge-hSER [Å/min] | 647 | 271 | 234 |
| Ratio Ge-MRR to Ge-hSER | 5.0 | 8.0 | 9.4 |
| Oxide-MRR [Å/min] | | | |
| Ratio Ge-MRR to Oxide-MRR | | | |

The CMP processes of the invention using these examples of CMP compositions show an improved polishing performance.

The invention claimed is:

1. A process for manufacturing a semiconductor device comprising chemically and mechanically polishing at least one of an elemental germanium and $Si_{1-x}Ge_x$ material, wherein 0.1≤x<1, in the presence of a chemical mechanical polishing (CMP) composition comprising:
   (A) at most 10 wt. % of inorganic particles, organic particles, or a mixture or composite thereof;
   (B) an oxidizing agent;
   (C) an organic compound which comprises at least {k} moieties (Z), but excluding salts whose anions are inorganic and whose only organic cation is $[NR^{11}R^{12}R^{13}R^{14}]^+$, wherein
   {k} is 1, 2 or 3,
   (Z) is a hydroxyl (—OH), alkoxy ($OR^1$), heterocyclic alkoxy (—$OR^1$ as part of a heterocyclic structure), carboxylic acid (—COOH), carboxylate (—$COOR^2$), amino (—$NR^3R^4$), heterocyclic amino (—$NR^3R^4$ as part of a heterocyclic structure), imino (=N—$R^5$ or —N=$R^6$), heterocyclic imino (=N—$R^5$ or —N=$R^6$ as part of a heterocyclic structure), phosphonate (—P(=O)($OR^7$)($OR^8$)), phosphate (—O—P(=O)($OR^9$)($OR^{10}$)), phosphonic acid (—P(=O)(OH)$_2$), phosphoric acid (—O—P(=O)(OH)$_2$) moiety, or their protonated or deprotonated forms thereof,
   $R^1$, $R^2$, $R^7$, $R^9$ are each independently alkyl, aryl, alkylaryl, or arylalkyl,
   $R^3$, $R^4$, $R^5$, $R^8$, $R^{10}$ are each independently H, alkyl, aryl, alkylaryl, or arylalkyl,
   $R^6$ is alkylene, or arylalkylene, R¹¹, R¹², R¹³ are each independently H, alkyl, aryl, alkylaryl, or arylalkyl, and R¹¹, R¹², R¹³ does not comprise any moiety (Z), and
R¹⁴ is alkyl, aryl, alkylaryl, or arylalkyl, and R¹⁴ does not comprise any moiety (Z); and
(D) an aqueous medium,
wherein a pH value of the CMP composition is from 2.5 to 5.5.

2. The process according to claim 1, wherein {k} is 2 and wherein
(Z) is a hydroxyl (—OH), alkoxy (—OR¹), heterocyclic alkoxy (—OR¹ as part of a heterocyclic structure), carboxylic acid (—COOH), amino (—NR³R⁴), heterocyclic amino (—NR³R⁴ as part of a heterocyclic structure), imino (=N—R⁵ or —N=R⁶), heterocyclic imino (=N—R⁵ or —N=R⁶ as part of a heterocyclic structure) moiety, or a protonated or deprotonated form thereof.

3. The process according to claim 1, wherein the CMP composition comprises:
(A) silica particles, in an amount of from 0.01 to 5% by weight of the CMP composition;
(B) hydrogen peroxide, in an amount of from 0.2 to 5% by weight of the CMP composition;
(C) an organic compound which comprises at least two moieties (Z) in an amount of from 0.001 to 5% by weight of the CMP composition, wherein
(Z) is a hydroxyl (—OH), alkoxy (—OR¹), heterocyclic alkoxy (—OR¹ as part of a heterocyclic structure), carboxylic acid (—COOH), amino (—NR³R⁴), heterocyclic amino (—NR³R⁴ as part of a heterocyclic structure), imino (=N—R⁵ or —N=R⁶), heterocyclic imino (=N—R⁵ or —N=R⁶ as part of a heterocyclic structure) moiety, or a protonated or deprotonated form thereof,
R¹ is alkyl, aryl, alkylaryl, or arylalkyl,
R³ is H, alkyl, aryl, alkylaryl, or arylalkyl,
R⁴ is H, alkyl, aryl, alkylaryl, or arylalkyl,
R⁵ is H, alkyl, aryl, alkylaryl, or arylalkyl, and
R⁶ is alkylene, or arylalkylene; and
(D) an aqueous medium.

4. A process according to claim 1, wherein
(C) is

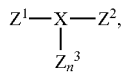

wherein n is zero, when X is oxygen and one, when X is nitrogen, and
Z¹, Z² and Z³ are each independently hydrogen, $C_1$- to $C_8$-alkyl, primary, secondary or tertiary $C_2$- to $C_8$-hydroxyalkyl, or secondary or tertiary $C_3$- to $C_8$-aminoalkyl, wherein an amino nitrogen may form a carboxylic or heterocarbocyclic unsaturated or saturated 5- or 6-membered ring, wherein a hetero atom is oxygen or nitrogen and the heteroatoms are not adjacent to each other,
optionally substituted on a carbon atom with $C_2$- to $C_8$-hydroxyalkyl, $C_3$- to $C_8$-alkoxyalkyl, $C_3$- to $C_8$-carboxyalkyl, or $C_2$- to $C_8$-amino optionally substituted by primary, secondary or tertiary $C_2$- to $C_4$-hydroxyalkyl optionally substituted by an amino group, $C_3$- to $C_8$-carboxyalkyl, hydrogen, primary, secondary or tertiary $C_2$- to $C_8$-hydroxyalkyl, or $C_2$- to $C_8$-amino optionally substituted by primary, secondary or tertiary $C_2$- to $C_4$-hydroxyalkyl,
Z¹ and Z² form a carboxylic or heterocarbocyclic unsaturated or saturated 5- or 6-membered ring, wherein the hetero atom is oxygen or nitrogen, a number thereof is 1 or 2, and the heteroatoms are not adjacent to each other, optionally substituted on a carbon atom with $C_2$- to $C_8$-hydroxyalkyl, $C_3$- to $C_8$-alkoxyalkyl, $C_3$- to $C_8$-carboxyalkyl, $C_2$- to $C_8$-aminoalkyl, optionally substituted by $C_1$- to $C_4$-alkyl, or $C_2$- to $C_8$-amino optionally substituted by primary, secondary or tertiary $C_2$- to $C_4$-hydroxyalkyl optionally substituted by an amino group, and
Z³ is hydrogen, $C_1$- to $C_8$-alkyl, $C_2$- to $C_8$-alkenyl or $C_2$- to $C_8$-alkinyl,
or a salt thereof, with the proviso that Z¹, Z² and Z³ are not identical and hydrogen, $C_1$- to $C_8$-alkyl or a combination thereof.

5. The process according to claim comprising polishing elemental germanium.

6. The process according to claim 1, comprising polishing $Si_{1-x}Ge_x$.

7. The process according to claim 1, wherein the elemental germanium has been filled or grown in trenches between STI (shallow-trench isolation) silicon dioxide.

8. The process according to claim 1, wherein the elemental germanium has a shape of a layer, overgrowth, or both, and has a germanium content, $Si_{1-x}Ge_x$ content, or both, of more than 98% by weight of the corresponding layer, overgrowth, or both.

9. The process according to claim 1, wherein an amount of the compound (C) is from 0.001 to 5% by weight of the CMP composition.

10. The process according to claim 1, wherein the compound (C) is an amino carboxylic acid or a salt thereof.

11. The process according to claim 1, wherein the compound (C) is an organic compound comprising at least two carboxylic acid (—COOH) groups, or a salt thereof.

12. The process according to claim 1, wherein the compound (C) is an amino alcohol, an amino ether, or a salt thereof.

13. The process according to claim 1, wherein the compound (C) is an organic compound comprising at least two hydroxyl (—OH) groups, or a salt thereof.

14. The process according to claim 1, wherein the compound (C) is a heterocyclic compound comprising nitrogen, or a salt thereof.

15. The process according to claim 1, wherein the polishing is the sole polishing step in the process.

16. A CMP composition, comprising:
(A) at most 10 wt. % of inorganic particles, organic particles, or a mixture or composite thereof;
(B) an oxidizing agent;
(C) an organic compound which comprises at least {k} moieties (Z), but excluding salts whose anions are inorganic and whose only organic cation is [NR¹¹R¹²R¹³R¹⁴]⁺,
wherein
{k} is 1, 2 or 3,
(Z) is a hydroxyl (—OH), alkoxy (OR¹), heterocyclic alkoxy (—OR¹ as part of a heterocyclic structure), carboxylic acid (—COOH), carboxylate (—COOR²), amino (—NR³R⁴), heterocyclic amino (—NR³R⁴ as part of a heterocyclic structure), imino (=N—R⁵ or —N=R⁶), heterocyclic imino (=N—R⁵ or —N=R⁶ as part of a heterocyclic structure), phosphonate (—P(=O)(OR⁷)(OR⁸)), phosphate (—O—P(=O)(OR⁹)

($OR^{10}$)), phosphonic acid (—P(=O)(OH)$_2$), phosphoric acid (—O—P(=O)(OH)$_2$) moiety, or their protonated or deprotonated forms thereof, $R^1$, $R^2$, $R^7$, $R^9$ are each independently alkyl, aryl, alkylaryl, or arylalkyl, $R^3$, $R^4$, $R^5$, $R^8$, $R^{10}$ are each independently H, alkyl, aryl, alkylaryl, or arylalkyl, $R^6$ is alkylene, or arylalkylene, $R^{11}$, $R^{12}$, $R^{13}$ are each independently H, alkyl, aryl, alkylaryl, or arylalkyl, and $R^{11}$, $R^{12}$, $R^{13}$ does not comprise any moiety (Z), and $R^{14}$ is alkyl, aryl, alkylaryl, or arylalkyl, and $R^{14}$ does not comprise any moiety (Z);

and (D) an aqueous medium, wherein a pH value of the CMP composition is from 2.5 to 5.5, and the composition is suitable for chemical-mechanical polishing of a substrate comprising at least one selected from the group consisting of an elemental germanium layer, an elemental germanium overgrowth, layer, and $Si_{1-x}Ge_x$ overgrowth.

17. The CMP composition according to claim 16, wherein (C) is

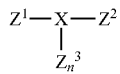

wherein n is zero, when X is oxygen and one, when X is nitrogen, and $Z^1$, $Z^2$ and $Z^3$ are each independently $C_1$- to $C_8$-alkyl, primary, secondary or tertiary $C_2$- to $C_8$-hydroxyalkyl, or secondary or tertiary $C_3$- to $C_8$-aminoalkyl, wherein an amino nitrogen may form a carboxyclic or heterocarbocyclic unsaturated or saturated 5- or 6-membered ring, wherein a hetero atom is oxygen or nitrogen and the heteroatoms are not adjacent to each other, optionally substituted on a carbon atom with $C_2$- to $C_8$-hydroxyalkyl, $C_3$- to $C_8$-alkoxyalkyl, $C_3$- to $C_8$-carboxyalkyl, or $C_2$- to $C_8$-amino optionally substituted by primary, secondary or tertiary $C_2$- to $C_4$-hydroxyalkyl optionally substituted by an amino group, $C_3$- to $C_8$-carboxyalkyl, hydrogen, primary, secondary or tertiary $C_2$- to $C_8$-hydroxyalkyl, or $C_2$- to $C_8$-amino optionally substituted by primary, secondary or tertiary $C_2$- to $C_4$-hydroxyalkyl, $Z^1$ and $Z^2$ forms a carboxyclic or heterocarbocyclic unsaturated or saturated 5- or 6-membered ring, wherein the hetero atom is oxygen or nitrogen, a number thereof is 1 or 2, and the heteroatoms are not adjacent to each other, optionally substituted on a carbon atom with $C_2$- to $C_8$-hydroxyalkyl, $C_3$- to $C_8$-alkoxyalkyl, $C_3$- to $C_8$-carboxyalkyl, $C_2$- to $C_8$-aminoalkyl, optionally substituted by $C_1$- to $C_4$-alkyl, or $C_2$- to $C_8$-amino optionally substituted by primary, secondary or tertiary $C_2$- to $C_4$-hydroxyalkyl optionally substituted by an amino group, and $Z^3$ is hydrogen, $C_1$- to $C_8$-alkyl, $C_3$- to $C_8$-alkenyl or $C_2$- to $C_8$-alkinyl, or a salt thereof, with the proviso that $Z^1$, $Z^2$ and $Z^3$ are not identical and hydrogen, $C_1$- to $C_8$-alkyl or a combination thereof.

* * * * *